US006934645B2

(12) United States Patent
Kim (10) Patent No.: US 6,934,645 B2
(45) Date of Patent: Aug. 23, 2005

(54) TEMPERATURE SENSOR SCHEME

(75) Inventor: Jung Pill Kim, Cary, NC (US)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 10/672,246

(22) Filed: Sep. 25, 2003

(65) Prior Publication Data

US 2005/0071116 A1 Mar. 31, 2005

(51) Int. Cl.$^7$ .......................... G01R 19/00; G01K 7/01; H05B 1/02
(52) U.S. Cl. ..................... 702/64; 219/481; 219/497; 374/178; 374/183; 700/278
(58) Field of Search ............................ 702/57, 64, 63, 702/65, 99, 130, 132, 133; 374/178, 183; 700/278; 219/481, 497

(56) References Cited

U.S. PATENT DOCUMENTS

| 4,228,511 A | * 10/1980 | Simcoe et al. ............... 700/278 |
| 4,302,663 A | * 11/1981 | Chesnut et al. .............. 219/497 |
| 4,395,139 A | 7/1983 | Namiki et al. ............... 374/178 |
| 5,085,526 A | 2/1992 | Sawtell et al. ............... 374/101 |
| 5,993,060 A | 11/1999 | Sakurai ....................... 374/178 |
| 6,149,299 A | * 11/2000 | Aslan et al. ................. 374/178 |
| 6,455,820 B2 | * 9/2002 | Bradenbaugh ............... 219/481 |
| 6,612,738 B2 | 9/2003 | Beer et al. ................... 374/183 |
| 2003/0123522 A1 | 7/2003 | Hsu et al. .................... 374/185 |
| 2004/0071191 A1 | 4/2004 | Sim et al. .................... 374/185 |

OTHER PUBLICATIONS

Stehouwer, M., "Temperature Monitor," Elektor Electronics, vol. 19, No. 217, pp. 50, (Dec. 1993).
A copy of PCT International Search Report for International Application No. PCT/EP2004/010579 mailed on Jan. 25, 2005 (7 pages).

* cited by examiner

*Primary Examiner*—Michael Nghiem
*Assistant Examiner*—John Le
(74) *Attorney, Agent, or Firm*—Dicke, Billig & Czaja, PLLC (57) ABSTRACT

The present invention is a random access memory device including a temperature sensing circuit, and method of using the same. The temperature sensing circuit includes a first and a second comparator. Each comparator is configured to receive a sense voltage that is indicative of a sensed temperature. A first temperature reference circuit having a plurality of first reference voltages is coupled to the first comparator. The plurality of first reference voltages are alternately compared with the sense voltage. A second temperature reference circuit having a plurality of second reference voltages is coupled to the second comparator. The plurality of second reference voltages are alternately compared with the sense voltage. A first trimmer is coupled to the first temperature reference circuit. A second trimmer coupled to the second temperature reference circuit. The first and second trimmers are independently adjustable to adjust the plurality of first and second reference voltages.

20 Claims, 4 Drawing Sheets

TEMPERATURE SENSOR SCHEME

BACKGROUND

The present invention relates to a temperature sensing circuit for sensing temperature. Specifically, the temperature sensing circuit utilizes individually adjustable comparators to determine temperature.

In memory storage devices, densities are steadily increasing and chip areas are being reduced. In addition, operating frequencies are continually increasing. As a result, the energy density introduced into the semiconductor material of the memory systems is increasing. Considerable power loss is generated during the operation of these memory systems. This leads to temperature increases within the semiconductor chips.

Typically, the behavior of the semiconductor chip is affected by temperature increases. For example, in dynamic memory systems such as dynamic random access memory (DRAM) and synchronous dynamic random access memory (SDRAM), memory must be periodically refreshed in order to maintain the charges that represent the stored data. The frequency with which the memory must be refreshed varies with temperature. Consequently, the temperature within the semi-conductor chip must be sensed so that the appropriate refresh rate can be selected.

For low power or mobile or DRAM applications where decreasing current consumption is emphasized in order to increase battery life, various techniques are utilized in an attempt of minimize refresh operation, because it consumes significant current. One such technique is to ensure that the refresh rate does not occur more frequency than required to retain data in memory storage.

Consequently, many applications sense temperature changes in the memory chip so that adjustments can be made to the refresh rate as temperatures vary. For example, the lower the temperature of the device, the lower the refresh rate required to retain data. As the refresh rate is decreased additional power savings is enjoyed.

Various temperature sensing circuits have been employed to sense the temperature of devices in order to make adjustments to the refresh rate. Once such circuit utilizes comparators that compare a sensed temperature to known values in order to determine the level of the sensed temperature. Since relatively small changes in sensed voltage translate to significant changes in temperature, even small amounts of error in these comparators lead to significant errors in sensed temperature. Consequently, an improved sensing circuit would be a useful improvement in the art.

SUMMARY

The present invention is a random access memory device including a temperature sensing circuit, and method of using the same. The temperature sensing circuit includes a first and a second comparator. Each comparator is configured to receive a sense voltage that is indicative of a sensed temperature. A first temperature reference circuit having a plurality of first reference voltages is coupled to the first comparator. The plurality of first reference voltages are alternately compared with the sense voltage. A second temperature reference circuit having a plurality of second reference voltages is coupled to the second comparator. The plurality of second reference voltages are alternately compared with the sense voltage. A first trimmer is coupled to the first temperature reference circuit. A second trimmer coupled to the second temperature reference circuit. The first and second trimmers are independently adjustable to adjust the plurality of first and second reference voltages.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
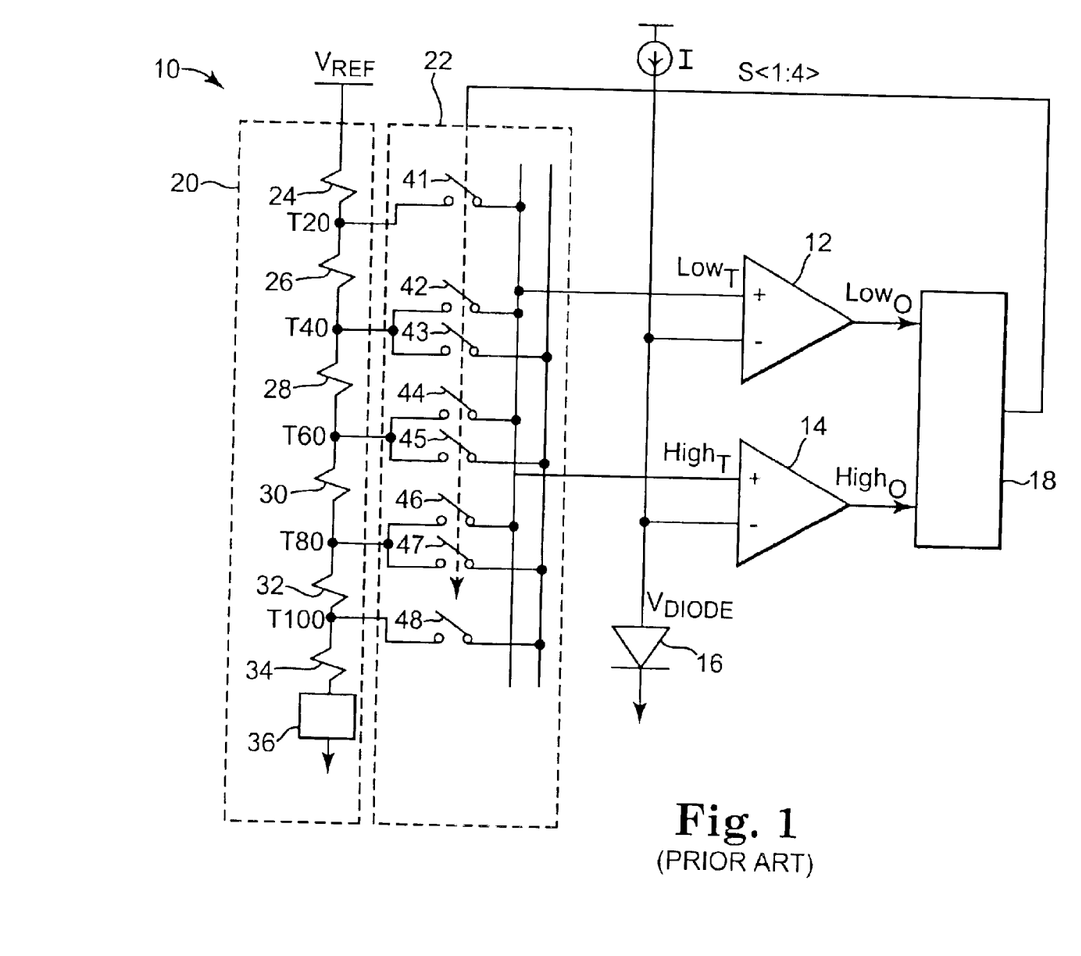
FIG. 1 illustrates a prior art temperature sensor circuit.

FIG. 1 illustrates prior art temperature sensor circuit 10. Temperature sensor circuit 10 includes low comparator 12, high comparator 14, sense diode 16, control logic 18, temperature reference network 20, and switch network 22. Sense diode 16 is configured to be placed in proximity to a location at which the temperature needs to be sensed. Sense diode 16 is further configured to have a diode voltage $V_{DIODE}$ that is changes with changes in temperature at the location proximate to diode 16. Typically, diode voltage $V_{DIODE}$ decreases with increases in temperature, and the decrease is fairly linear.

Both comparators 12 and 14 have a positive input, a negative input and an output. The negative inputs to both comparators 12 and 14 are tied to sense diode 16 and to a current source. The positive inputs of both comparators 12 and 14 are tied to switch network 22. The output of low comparator 12 (producing "$Low_O$" signal) and the output of high comparator 14 (producing "$High_O$" signal) are tied to control logic 18. Both $Low_O$ and $High_O$ signals are received by control logic 18. Control logic 18 is coupled to switch network 22. Control logic 18 produces first, second, third, and fourth control signals S1, S2, S3, and S4, which are received by switch network 22.

Switch network 22 include first, second, third, fourth, fifth, sixth, seventh and eighth switches 41–48. Temperature reference network 20 includes pull up resistor 24, first, second, third, and fourth reference resistors 26, 28, 30, and 32, pull down resistor 34, and trimmer 36.

The resistors in temperature reference network 20 are configured to form a plurality of nodes. Pull up resistor 24 is coupled to a reference voltage ($V_{REF}$). Pull up resistor 24 is then coupled to first resistor 26 to form node T20 therebetween. First resistor 26 and second resistor 28 are then coupled to form node T40 therebetween. Second resistor 28 and third resistor 30 are then coupled to form node T60 therebetween. Third resistor 30 and fourth resistor 32 are then coupled to form node T80 therebetween. Finally, pull down resistor 34 and fourth resistor 32 are coupled to form node T100 therebetween. Trimmer 36 is coupled to pull down resistor 34.

First through eighth switches 41–48 are coupled between the positive input terminals of low and high comparators 12 and 14 and temperature reference network 20. Specifically, first switch 41 is coupled between the positive input of low comparator 12 and node T20. Second switch 42 is coupled between the positive input of low comparator 12 and node T40. Third switch 43 is coupled between the positive input of high comparator 14 and node T40. Fourth switch 44 is coupled between the positive input of low comparator 12 and node T60. Fifth switch 45 is coupled between the positive input of high comparator 14 and node T60. Sixth switch 46 is coupled between the positive input of low comparator 12 and node T80. Seventh switch 47 is coupled between the positive input of high comparator 14 and node T80. Eighth switch 48 is coupled between the positive input of high comparator 14 and node T100.

Control logic 18 produces first, second, third, and fourth control signals S1, S2, S3, and S4, which control these first-eighth switches 41–48. In one embodiment, first control signal S1 controls sixth and eighth switches 46 and 48. Second control S2 controls fourth and seventh switches 44 and 47. Third control signal S3 controls second and fifth switches 42 and 45. Fourth control signal S4 controls first and third switches 41 and 43. When the control signal is "high", the switches controlled by that signal close, and when the control signal is "low", the switches controlled by that signal open.

In operation, the reference voltage $V_{REF}$ is internally generated and independent of voltage and temperature variation. The reference voltage $V_{REF}$ and the resistors of temperature reference network 20 provide multiple temperature reference voltages at nodes T20, T40, T60, T80, and T100. These reference voltages can be set to correspond to diode voltage $V_{DIODE}$ ($V_{T20}$, $V_{T40}$, $V_{T60}$, $V_{T80}$, and $V_{T100}$) at corresponding temperatures, 20 degrees, 40 degrees, 60 degrees, 80 degrees, and 100 degrees Celsius.

In operation, temperature sensor circuit 10 senses system or device temperature via sensing diode 16 by placing sensing diode 16 at or near the location where temperature is to be sensed. For example, temperature sensing circuit 10 may be implemented inside a DRAM chip, such that it is sensing the operating temperature of the DRAM chip. Diode voltage $V_{DIODE}$ then changes with changes in temperature at the location of sensing diode 16. Typically, diode voltage $V_{DIODE}$ decreases approximately two millivolts (mV) per one degree Celsius of temperature change. In addition, the voltage characteristic of the diode versus temperature is very linear.

Figure 2:
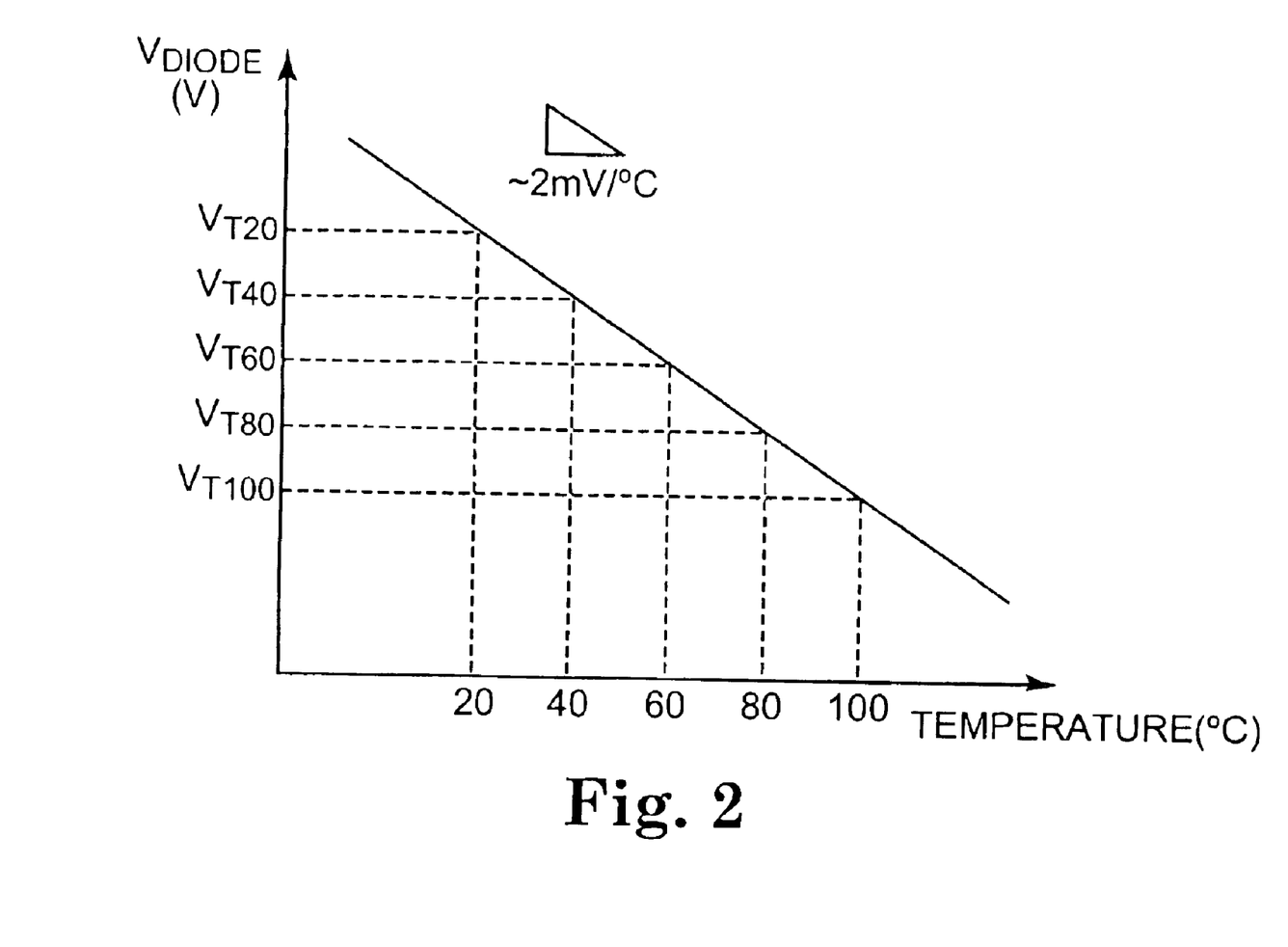
FIG. 2 is a graphic illustrating voltage relative to temperature.

FIG. 2 illustrates the linear relation between diode voltage and temperature for a sensing diode like diode 16. Consequently, once a diode with a particular technology is chosen, the corresponding diode voltages and temperatures can be easily determined. Thus, voltage values at each of 20 degrees, 40 degrees, 60 degrees, 80 degrees, and 100 degrees Celsius are associated with corresponding voltage values of sensing diode 16, $V_{T20}$, $V_{T40}$, $V_{T60}$, $V_{T80}$, and $V_{T100}$, as shown in FIG. 2.

Using the reference voltages at nodes T20, T40, T60, T80, and T100 in temperature reference network 20 and their known relationship to the sensed diode 16 voltages $V_{T20}$, $V_{T40}$, $V_{T60}$, $V_{T80}$, and $V_{T100}$, temperature sensing circuit 10 can be used to identify the temperature range for a location or device. In operation, sensing diode 16 is placed in proximity to the desired location at which a temperature needs to be sensed. The diode voltage $V_{DIODE}$ on sensing diode 16 is coupled to the negative input of low and high comparators 12 and 14. The diode voltage $V_{DIODE}$ is then compared against the reference voltages from temperature reference network 20 in accordance with control logic 18.

Figure 3:
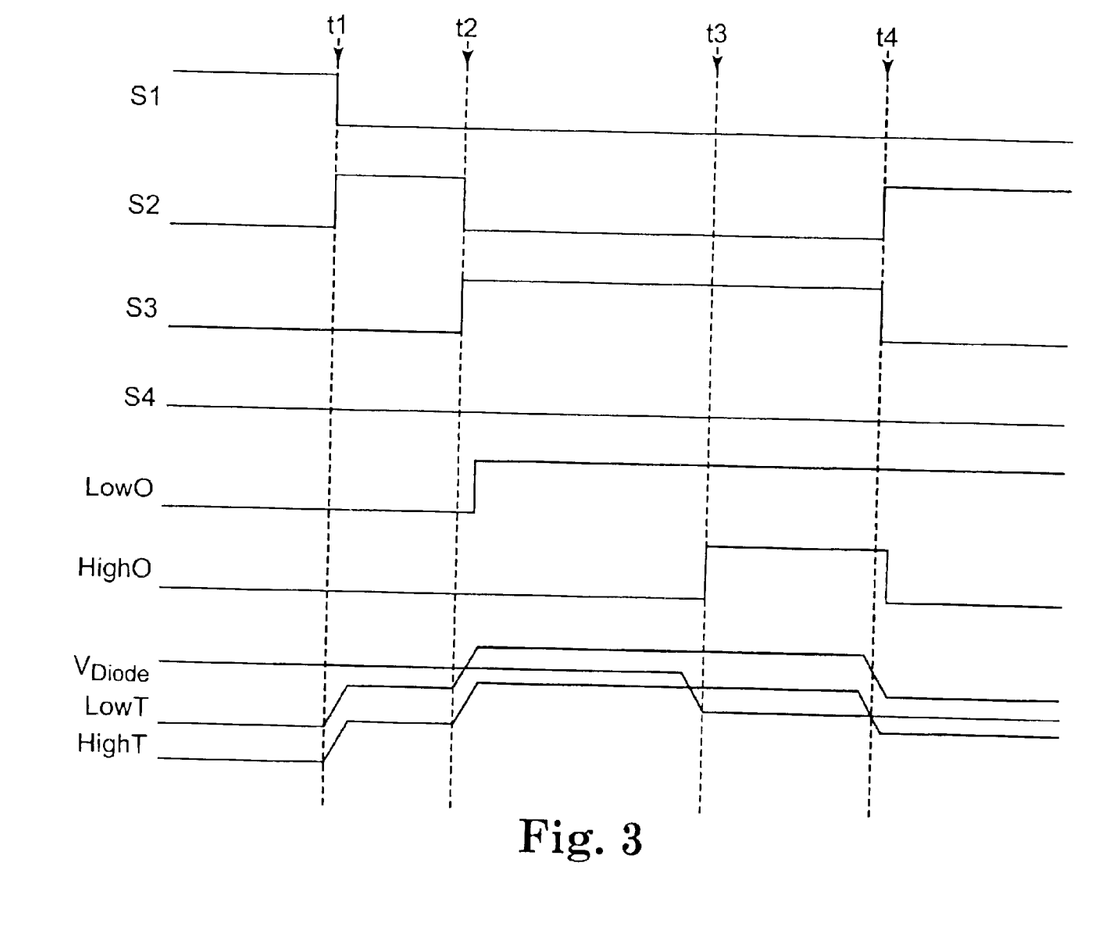
FIG. 3 illustrates timing signals for a temperature sensing circuit.

For example, temperature sensing circuit 10 is integrated in a DRAM chip such that sensing diode 16 is located at a place where temperature is desired to be measured. When sensing circuit 10 is initiated, the temperature at sensing diode is 50 degrees Celsius. Initially, control logic 18 sets first control signal S1 high and sets the remaining control signals, S2–S4, low. Since first control signal S1 controls sixth and eighth switches 46 and 48 and the S1 signal is high, switches 46 and 48 close. Since the remaining control signals S2–S4 are low, the remaining switches 41 and 43, 42 and 45, and 44 and 46 are all open. Thus, under these conditions the positive input of low comparator 12 is coupled to node T80 and the positive input to high comparator 14 is coupled to node T100. The voltage ($Low_T$) at the positive input of low comparator 12 is compared with the diode voltage $V_{DIODE}$ and the voltage ($High_T$) at the positive input of high comparator 14 is compared with the diode voltage $V_{DIODE}$. Since the ambient temperature sensed by sense diode 16 is 50 degrees Celsius, diode voltage $V_{DIODE}$ higher relative to the $Low_T$ and $High_T$ voltages, which are voltages based on temperatures of 80 and 100 degrees Celsius (voltages increase with lower temperature). Thus, the output ($Low_O$) of low comparator 12 and output ($High_O$) of high comparator 14 are low. The waveforms that illustrate these conditions are illustrated in FIG. 3 before time t1.

Next, control logic 18 changes control signals such that second control signal S2 transitions to high and remaining control signals S1, S3, and S4 transition to low at time t1. With second control signal S2 high, switches 44 and 47 close. With each of the remaining control signals S1, S3 and S4 low all of the other switches 41 and 43, 42 and 47, and 46 and 48 are open. Thus, under these conditions the positive input of low comparator 12 is coupled to node T60 and the positive input of high comparator 14 is coupled to node T80. Again, the voltage ($Low_T$) at the positive input of low comparator 12 is compared with the diode voltage $V_{DIODE}$ and the voltage ($High_T$) at the positive input of high comparator 14 is compared with the diode voltage $V_{DIODE}$. Since the ambient temperature sensed by sense diode 16 is 50 degrees Celsius, diode voltage $V_{DIODE}$ higher relative to the $Low_T$ and $High_T$ voltages, which are voltages based on temperatures of 60 and 80 degrees Celsius. Thus, the output ($Low_O$) of low comparator 12 and output ($High_O$) of high comparator 14 are low. The waveforms that illustrate these conditions are shown in FIG. 3 between time t1 and time t2.

Next, control logic 18 changes control signals such that third control signal S3 transitions high and the remaining control signals transition low at time t2. With third control signal S3 high, switches 42 and 45 close. With each of the remaining control signals S1, S2, and S4 low, switches 46 and 48, 44 and 47, and 41, and 43 are open. Thus, under these conditions the positive input of low comparator 12 is coupled to node T40 and the positive input of high comparator 14 is coupled to node T60. Again, the voltage ($Low_T$) at the positive input of low comparator 12 is compared with the diode voltage $V_{DIODE}$ and the voltage ($High_T$) at the positive input of high comparator 14 is compared with the diode voltage $V_{DIODE}$. Since the ambient temperature sensed by sense diode 16 is 50 degrees Celsius, diode voltage $V_{DIODE}$ is higher relative to the High$_T$ voltage, which is a voltage based on a temperature of 60 degrees Celsius. Thus, the output (High$_O$) of high comparator 14 is low. However, diode voltage $V_{DIODE}$ is lower relative to the Low$_T$ voltage, which is a voltage based on a temperature of 40 degrees Celsius. Thus, the output (Low$_O$) of low comparator 12 transitions high. This indicates to control logic 18 that since the diode voltage $V_{DIODE}$ is between the reference voltages T40 and T60, the temperature at sense diode 16 is between 40 and 60 degrees Celsius. The waveforms that illustrate these conditions are illustrated in FIG. 3 between time t2 and time t3.

Next, the ambient temperature sensed by diode sensor 16 changes from 50 to 70 degrees Celsius at time t3, but all control signals S1–S4 remain unchanged. Under these conditions diode voltage $V_{DIODE}$ is lower relative to the High$_T$ voltage, which is a voltage based on a temperature of 60 degrees Celsius, and also lower relative to the Low$_T$ voltage, which is a voltage based on a temperature of 40 degrees Celsius. Thus, the output (High$_O$) of high comparator 14 transitions high and the output (Low$_O$) of low comparator 12 remains high. This indicates to control logic 18 that the diode voltage $V_{DIODE}$ is no longer within the reference voltages T40 and T60. The waveforms that illustrate these conditions are illustrated in FIG. 3 between time t3 and time t4.

Finally, control logic 18 changes control signals such that second control signal S2 transitions to high and remaining control signals S1, S3, and S4 transition to low at time t1. With second control signal S2 high, switches 44 and 47 close. With each of the remaining control signals S1, S3 and S4 low all of the other switches 41 and 43, 42 and 47, and 46 and 48 are open. Thus, under these conditions the positive input of low comparator 12 is coupled to node T60 and the positive input of high comparator 14 is coupled to node T80. Again, the voltage (Low$_T$) at the positive input of low comparator 12 is compared with the diode voltage $V_{DIODE}$ and the voltage (High$_T$) at the positive input of high comparator 14 is compared with the diode voltage $V_{DIODE}$. Since the ambient temperature sensed by sense diode 16 is now 70 degrees Celsius, diode voltage $V_{DIODE}$ is higher relative to the High$_T$ voltage, which is a voltage based on a temperature of 80 degrees Celsius. Thus, the output (High$_O$) of high comparator 14 transitions low. However, diode voltage $V_{DIODE}$ is lower relative to the Low$_T$ voltage, which is a voltage based on a temperature of 60 degrees Celsius. Thus, the output (Low$_O$) of low comparator 12 remains high. This indicates to control logic 18 that since the diode voltage $V_{DIODE}$ is between the reference voltages T60 and T80, the temperature at sense diode 16 is between 60 and 80 degrees Celsius. The waveforms that illustrate these conditions are illustrated in FIG. 3 after time t4.

Trimmer 36 in temperature reference network 20 is used to adjust each of the voltage reference levels at nodes T20, T40, T60, T80, and T100 of temperature reference network 20 when the voltage $V_{DIODE}$ of sense diode 16 deviates from a target value. One important effect that causes the $V_{DIODE}$ of sense diode 16 to vary from a target value is input offset voltage of low and high comparators 12 and 14. Input offset voltage is an imbalance caused by a mismatch of transistors that make up the comparators. Input offset voltage is mainly caused by process effect and a small voltage must be applied to the input in order to "trim out" or balance the offset voltage in the comparators. This is accomplished with trimmer 36. Trimmer 36 is a variable resistor such as a potentiometer or is comprised of a plurality of resistors that can be added to or removed from trimmer 36 to adjust its effective resistance.

The input offset voltage can have a significant affect on the accuracy of temperature sensing circuit 10. Typically, the input offset voltage may be in the range of plus or minus 10 mV. This type of offset can correspond to an error as large as 5 degrees Celsius. Consequently, the input offset voltage must be removed or minimized in order to have a highly accurate temperature sensor.

The limitation of temperature sensor circuit 10 is that there is no way to individually or independently trim the input offset voltage of low and high comparators 12 and 14. If the input offset voltages of low and high comparators 12 and 14 are not in the same direction, that is, not of the same polarity, there is no way to adjust the input offset voltages with trimmer 36. For example, if the input offset voltage for low comparator 12 is positive 10 mV, and the input offset voltage for high comparator 14 is negative 10 mV, trimmer 36 cannot be adjusted to balance the input offset voltages.

Figure 4:
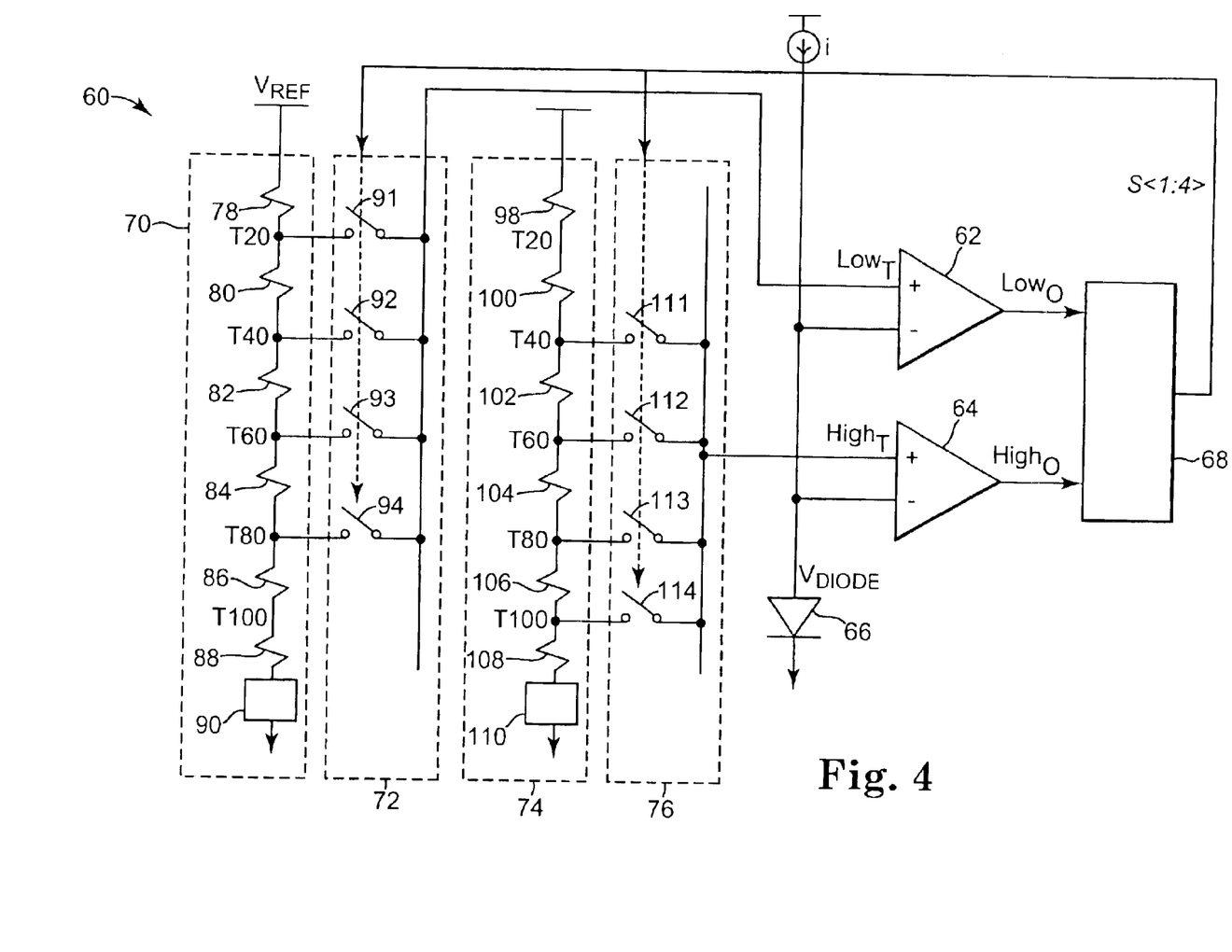
FIG. 4 illustrates a temperature sensor circuit in accordance with the present invention.

FIG. 4 illustrates temperature sensor 60 in accordance with the present invention. Temperature sensor circuit 60 includes low comparator 62, high comparator 64, sensing diode 66, control logic 68, first temperature reference network 70, first switch network 72, second temperature reference network 74, and second switch network 76. Temperature sensor circuit 60 is configured to sense temperature and is configured to have comparators with independently adjustable input offset voltage.

Both comparators 62 and 64 have a positive input, a negative input and an output. The negative inputs to both comparators 62 and 64 are tied to sense diode 66 and to a current source. The positive input of low comparator 62 is tied to first switch network 72 and the positive input high comparator 64 is tied to second switch network 76. The output of low comparator 62 (producing "Low$_O$" signal) and the output of high comparator 64 (producing "High$_O$" signal) are tied to control logic 68. Both Low$_O$ and High$_O$ signals are received by control logic 68. Control logic 68 is coupled to first and second switch networks 72 and 76. Control logic 68 produces first, second, third, and fourth control signals S1, S2, S3, and S4, which are received by first and second switch networks 72 and 76.

First switch network 72 includes first, second, third and fourth switches 91–94. Second switch network 76 includes first, second, third and fourth switches 111–114. First temperature reference network 70 includes pull up resistor 78, first, second, third, and fourth reference resistors 80, 82, 84, and 86, pull down resistor 88, and trimmer 90. Second temperature reference network 74 includes pull up resistor 98, first, second, third, and fourth reference resistors 100, 102, 104, and 106, pull down resistor 108, and trimmer 110.

The resistors in first temperature reference network 70 are configured to form a plurality of nodes. Pull up resistor 78 is coupled to a reference voltage ($V_{REF}$). Pull up resistor 78 is then coupled to first resistor 80 to form node T20 of first temperature reference network 70 therebetween. First resistor 80 and second resistor 82 are then coupled to form node T40 therebetween. Second resistor 82 and third resistor 84 are then coupled to form node T60 therebetween. Third resistor 84 and fourth resistor 86 are then coupled to form node T80 therebetween. Finally, pull down resistor 88 and fourth resistor 86 are coupled to form node T100 therebetween. Trimmer 90 is coupled to pull down resistor 88.

Similarly, the resistors in second temperature reference network 74 are configured to form a plurality of nodes. Pull up resistor 98 is coupled to a reference voltage ($V_{REF}$). Pull up resistor 98 is then coupled to first resistor 100 to form node T20 of second temperature reference network 74 therebetween. First resistor 100 and second resistor 102 are then coupled to form node T40 therebetween. Second resistor 102 and third resistor 104 are then coupled to form node T60 therebetween. Third resistor 104 and fourth resistor 106 are then coupled to form node T80 therebetween. Finally, pull down resistor 108 and fourth resistor 106 are coupled to form node T100 therebetween. Trimmer 110 is coupled to pull down resistor 108.

First through fourth switches 91–94 of first switch network 72 are coupled between the positive input terminal of low comparator 62 and first temperature reference network 70. Specifically, first switch 91 of first switch network 72 is coupled between the positive input of low comparator 62 and node T20. Second switch 92 is coupled between the positive input of low comparator 92 and node T40. Third switch 93 is coupled between the positive input of low comparator 62 and node T60. Fourth switch 94 is coupled between the positive input of low comparator 62 and node T80.

Similarly, first through fourth switches 111–114 of second switch network 76 are coupled between the positive input terminal of high comparator 64 and second temperature reference network 74. First switch 111 is coupled between the positive input of high comparator 64 and node T40. Second switch 112 is coupled between the positive input of high comparator 64 and node T60. Third switch 113 is coupled between the positive input of high comparator 64 and node T80. Fourth switch 114 is coupled between the positive input of high comparator 64 and node T100.

Control logic 68 produces first, second, third, and fourth control signals S1, S2, S3, and S4, which control first-fourth switches 91–94 in first switch network 72 and first-fourth switches 111–114 in second switch network 74. In one embodiment, first control signal S1 controls first switch 91 in first switch network 72 and first switch 111 in second switch network 74. Second control signal S2 controls second switch 92 in first switch network 72 and second switch 112 in second switch network 74. Third control signal S2 controls third switch 93 in first switch network 72 and third switch 113 in second switch network 74. Fourth control signal S4 controls fourth switch 94 in first switch network 72 and fourth switch 114 in second switch network 74. When the control signal is "high", the switches controlled by that signal close, and when the control signal is "low", the switches controlled by that signal open.

In operation, the reference voltage $V_{REF}$ is internally generated and independent of voltage and temperature variation. The reference voltage $V_{REF}$ and the resistors of first and second temperature reference networks 72 and 76 provide multiple temperature reference voltages at nodes T20, T40, T60, T80, and T100. These reference voltages can be set to correspond to diode voltage $V_{DIODE}$ ($V_{T20}$, $V_{T40}$, $V_{T60}$, $V_{T80}$, and $V_{T100}$) at corresponding temperatures, 20 degrees, 40 degrees, 60 degrees, 80 degrees, and 100 degrees Celsius. Temperature reference voltages at nodes T20, T40, T60, and T80 in first temperature reference network 70 are made available to low comparator 62 and temperature reference voltages at nodes T40, T60, T80, and T100 in second temperature reference network 74 are made available to high comparator 64. These voltages may then be compared to diode voltage $V_{DIODE}$ at sensing diode 66.

In operation, temperature sensor circuit 60 senses system or device temperature via sensing diode 66 by placing sensing diode 66 at or near the location where temperature is to be sensed. For example, temperature sensing circuit 60 may be implemented inside a DRAM chip, such that it is sensing the operating temperature of the DRAM chip. Diode voltage $V_{DIODE}$ then changes with changes in temperature at the location of sensing diode 66.

As described previously, there is a linear relation between diode voltage and temperature for a sensing diode like diode 66. Consequently, once a diode with a particular technology is chosen, the corresponding diode voltages and temperatures can be easily determined. Thus, voltage values at each of 20 degrees, 40 degrees, 60 degrees, 80 degrees, and 100 degrees Celsius are associated with corresponding voltage values of sensing diode 66, $V_{T20}$, $V_{T40}$, $V_{T60}$, $V_{T80}$, and $V_{T100}$.

Using the reference voltages at nodes T20, T40, T60, T80, and T100 in first and second temperature reference networks 70 and 74 and their known relationship to the sensed diode 66 voltages $V_{T20}$, $V_{T40}$, $V_{T60}$, $V_{T80}$, and $V_{T100}$, temperature sensing circuit 60 can be used to identify the temperature range for a location or device. In operation, sensing diode 66 is placed in proximity to the desired location at which a temperature needs to be sensed. The diode voltage $V_{DIODE}$ on sensing diode 66 is coupled to the negative input of low and high comparators 62 and 64. The diode voltage $V_{DIODE}$ is then compared against the reference voltages from temperature reference network 60 in accordance with control logic 68.

Temperature sensing circuit 60 includes first and second temperature reference networks 70 and 74, each of which have trimmer (90 and 110). Trimmer 90 in first temperature reference network 70 is used to adjust each of the voltage reference levels at nodes T20, T40, T60, T80, and T100 of first temperature reference network 70 in order to balance or adjust the input offset voltage at low comparator 62. Similarly, trimmer 110 in second temperature reference network 74 is used to adjust each of the voltage reference levels at nodes T20, T40, T60, T80, and T100 of second temperature reference network 74 in order to balance or adjust the input offset voltage at high comparator 64. Typically, trimmers 90 and 110 are variable resistors, such as potentiometers, or are a plurality of resistors that can be added to or removed from trimmers 90 and 110 to adjust the effective resistance. Consequently, the input offset voltage at both low comparator 62 and at high comparator 64 can be individually balanced by adjusting trimmers 90 and 110, respectively, in order to have a highly accurate temperature sensor.

With temperature sensing circuit 60, each comparator has its own temperature reference network, and each network has its own trimmer, such that input offset voltage of low and high comparators 62 and 64 can be individually or independently trimmed. Thus, whether or not the input offset voltages of low and high comparators 62 and 64 are of the same polarity, trimmers 90 and 110 allow for independent adjustment. The input offset voltage of each comparator can be adjusted regardless of any other comparators. For example, if the input offset voltage for low comparator 62 is positive 10 mV, and the input offset voltage for high comparator 64 is negative 10 mV, trimmer 90 is adjusted appropriately to balance the positive 10 mV offset and trimmer 110 is appropriately to balance the negative 10 mV offset. With such a configuration, temperature sensing circuit 60 is a highly accurate temperature sensor.

Temperature sensing circuit 60 can be used in a variety of applications to provide accurate temperature sensing. For example, temperature sensing circuit 60 can be placed within a DRAM chip such that the temperature of the DRAM can be accurately measured and adjustments made accordingly. For example, the refresh rate of the DRAM system can be set relatively low when the DRAM is operating at lower temperatures, such as room temperature. Then, as temperature sensing circuit 60 detects that temperature is increasing, the refresh rate can be correspondingly increased to ensure data is retained. Allowing for lower refresh rates at lower temperatures will decrease the power consumed in the memory.

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, sensing diode 66 is illustrated in the present invention as a diode, but one skilled in the art will recognize that a bipolar junction transistor (BJT), or other similar device, can be used to accomplish the advantages of the present invention. This application is intended to cover any adaptations or variations of the specific embodiments discussed herein. Therefore, it is intended that this invention be limited only by the claims and the equivalents thereof.

What is claimed is:

1. A random access memory device including a temperature sensing circuit, the temperature sensing circuit comprising:
   a sensing device configured to hold a sensed voltage that varies with changes in temperature at the sensing device;
   a first comparator configured to receive the sensed voltage from the sensing device, the first comparator generating a first output signal;
   a second comparator configured to receive the sensed voltage from the sensing device, the second comparator generating a second output signal;
   a logic circuit configured to receive the first and second output signals;
   a first temperature reference circuit having a plurality of first reference voltages;
   a second temperature reference circuit having a plurality of second reference voltages;
   a first switch circuit coupled between the first temperature reference circuit and the first comparator, the first switch circuit controlled by the logic circuit such that a first reference voltage is applied to the first comparator;
   a second switch circuit coupled between the second temperature reference circuit and the second comparator, the second switch circuit controlled by the logic circuit such that a second reference voltage is applied to the second comparator;
   a first trimmer coupled to the first temperature reference circuit, the first trimmer being adjustable to adjust the first reference voltage; and
   a second trimmer coupled to the second temperature reference circuit, the second trimmer being adjustable to adjust the second reference voltage.

2. The random access memory device of claim 1 wherein the first trimmer is adjustable to correct for input offset voltage in the first comparator and the second trimmer is adjustable to correct for input offset voltage in the second comparator.

3. The random access memory device of claim 1 wherein the first trimmer are resistors that are is adjustable to correct for input offset voltage in the first comparator and the second trimmer are resistors that are is adjustable to correct for input offset voltage in the second comparator.

4. The random access memory device of claim 1 wherein the first and second trimmers are potentiometers that have adjustable resistance.

5. The random access memory device of claim 1 wherein the first and second trimmers are multiple resistors that may be removed and added to the trimmers in order to provide adjustable resistance.

6. A temperature sensing circuit comprising:
   a first and a second comparator each configured to receive a sense voltage that is indicative of a sensed temperature;
   a first temperature reference circuit having a plurality of first reference voltages coupled to the first comparator such that the plurality of first reference voltages are alternately compared with the sense voltage;
   a second temperature reference circuit having a plurality of second reference voltages coupled to the second comparator such that the plurality of second reference voltages are alternately compared with the sense voltage;
   a first trimmer coupled to the first temperature reference circuit and a second trimmer coupled to the second temperature reference circuit, the first and second trimmers being independently adjustable to adjust the plurality of first and second reference voltages; and
   wherein a first reference voltage compared to the sense voltage and a second reference voltage compared to the sense voltage are different from each other so that a determination is performed that the sensed temperature is in a range defined by the first reference voltage and the second reference voltage.

7. The temperature sensing circuit of claim 6 wherein the first trimmer is adjustable to correct for input offset voltage in the first comparator and the second trimmer is adjustable to correct for input offset voltage in the second comparator.

8. The temperature sensing circuit of claim 6 wherein the first and second trimmers are resistors.

9. The temperature sensing circuit of claim 6 wherein the first and second trimmers are potentiometers that have adjustable resistance.

10. The temperature sensing circuit of claim 6 wherein the first and second trimmers are multiple resistors that may be removed and added to the trimmers in order to provide adjustable resistance.

11. The temperature sensing circuit of claim 6 further including a sensing device configured to sense the sensed voltage that varies with changes in temperature at the sensing device.

12. The temperature sensing circuit of claim 6 further including a logic circuit configured to receive a first output signal from the first comparator and a second output signals from the second comparator.

13. The temperature sensing circuit of claim 12 further including a first switch circuit coupled between the first temperature reference circuit and the first comparator and a second switch circuit coupled between the second temperature reference circuit and the second comparator, the first and second switch circuits controlled by the logic circuit such that the plurality of first and second reference voltages are alternately compared with the sense voltage.

14. The temperature sensing circuit of claim 6 configured to be integrated into a random access memory device.

15. A method of decreasing current consumption in a dynamic memory device, the method including the steps of:

providing a semiconductor memory device with a temperature sensing circuit;

periodically refreshing the memory device at a refresh rate;

sensing the temperature of the dynamic memory device with the temperature sensing circuit and producing a corresponding sensed temperature voltage;

providing a first reference voltage;

comparing the sensed temperature voltage with the first reference voltage using a first comparator with a first offset voltage;

providing a second reference voltage;

comparing the sensed temperature voltage with the second reference voltage using a second comparator with a second offset voltage;

determining whether the sensed temperature voltage is within the first and second reference voltages;

adjusting the first reference voltage to balance the first input offset voltage of the first comparator; and adjusting the second reference voltage to balance the second input offset voltage of the second comparator.

16. The method of claim 15 further including the step of adjusting the refresh rate based on whether sensed temperature voltage is between the first and second reference voltages.

17. The method of claim 15 further including the step of decreasing the refresh rate when the sensed temperature voltage is between the first and second reference voltages.

18. A random access memory device comprising:

a first and a second comparator each configured to receive a sense voltage that is indicative of a sensed temperature;

first means coupled to the first comparator for alternately comparing a plurality of first reference voltages with the sense voltage;

second means coupled to the second comparator for alternately comparing a plurality of second reference voltages with the sense voltage;

third means coupled to the first means for independently adjusting the plurality of first reference voltages; and fourth means coupled to the second means for independently adjusting the plurality of second reference voltages; and wherein a first reference voltage compared to the sense voltage and a second reference voltage compared to the sense voltage are different from each other so that a determination is performed that the sensed temperature is in a range defined by the first reference voltage and the second reference voltage.

19. The random access memory device of claim 18 wherein the third means are resistors that are adjustable to correct for input offset voltage in the first comparator and the fourth means are resistors that are adjustable to correct for input offset voltage in the second comparator.

20. A random access memory device comprising:

a first and a second comparator each configured to receive a sense voltage that is indicative of a sensed temperature;

a first temperature reference circuit having a plurality of first reference voltages coupled to the first comparator such that the plurality of first reference voltages are alternately compared with the sense voltage;

a second temperature reference circuit having a plurality of second reference voltages coupled to the second comparator such that the plurality of second reference voltages are alternately compared with the sense voltage;

a first trimmer coupled to the first temperature reference circuit and a second trimmer coupled to the second temperature reference circuit, the first and second trimmers being independently adjustable to adjust the plurality of first and second reference voltages.

* * * * *